United States Patent
Strom et al.

(10) Patent No.: US 6,724,256 B1
(45) Date of Patent: Apr. 20, 2004

(54) RECEIVER WITH DELAY INSENSITIVE TO INPUT AMPLITUDE AND SLEW RATE

(75) Inventors: James David Strom, Rochester, MN (US); Patrick Lee Rosno, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/289,604

(22) Filed: Nov. 7, 2002

(51) Int. Cl.[7] .............................................. H03F 3/45
(52) U.S. Cl. ...................................... 330/252; 330/261
(58) Field of Search ................................. 330/252, 261, 330/267, 296; 327/359

(56) References Cited

U.S. PATENT DOCUMENTS

| | | | | |
|---|---|---|---|---|
| 3,774,117 A | * | 11/1973 | Kovacs | 330/261 |
| 4,586,000 A | * | 4/1986 | Wagner | 330/252 |
| 4,914,401 A | | 4/1990 | Mader | |
| 5,039,952 A | | 8/1991 | Dreps et al. | |
| 5,142,168 A | * | 8/1992 | Matsunaga | 330/253 |
| 5,357,209 A | | 10/1994 | Mader et al. | |
| 6,236,268 B1 | * | 5/2001 | Ridgers | 330/252 |
| 6,362,686 B1 | * | 3/2002 | Escobar-Bowser | 330/252 |
| 6,563,382 B1 | * | 5/2003 | Yang | 330/261 |

* cited by examiner

*Primary Examiner*—Nguyen Khanh Van
(74) *Attorney, Agent, or Firm*—Joan Pennington

(57) ABSTRACT

A receiver is provided with delay generally insensitive to input amplitude and slew rate. The receiver includes a first differential transistor pair having a common emitter connection. A differential input is applied to a respective base of the differential transistor pair. A pair of load transistors is connected to the respective collector of the differential transistor pair. A respective resistance is coupled to a base of the load transistors for providing a delay independent of the differential input; and a pair of bias transistors is coupled to the respective collector of the differential transistor pair for biasing the load transistors.

19 Claims, 5 Drawing Sheets

RECEIVER WITH DELAY INSENSITIVE TO INPUT AMPLITUDE AND SLEW RATE

FIELD OF THE INVENTION

The present invention relates generally to a receiver with delay generally insensitive to input amplitude and slew rate.

DESCRIPTION OF THE RELATED ART

Various arrangements are known for receivers or amplifiers. Differential amplifiers are known for various high-speed applications.

For example, U.S. Pat. No. 5,039,952, issued Aug. 13, 1991 and assigned to the present assignee, discloses an amplifier circuit including first and second gain cells connected in cascade. Each of the gain cells includes first and second common emitter differential transistors, a current source coupled to the emitters of the transistors, a first plurality of forward biased, series diodes connected between a power supply terminal and a base of the first transistor, and a second plurality of forward biased, series diodes connected between the power supply terminal and a base of the second transistor. A collector of the first transistor of the first gain cell is connected to the base of the first transistor of the second gain cell, and a collector of the second transistor of a first gain cell is connected to the base of the second transistor of the second gain cell. Because of the low inherent resistance of the biasing diodes, the operating speed of the amplifier is large, and the current amplification can be large without exceeding the power supply voltage. The current source limits the gain for high level signals without causing saturation of the transistors and therefore, does not comprise operating speed. The gain of each cell equals the numbers of diodes connected to the base of the transistor until the level of the current source.

U.S. Pat. No. 4,914,401, issued Apr. 3, 1990, discloses filters that are controlled and implemented with the aid of a differential gain stage. The differential gain stage includes pairs of like amplification components differential transistor pairs, and groups of series-connected diode components as well as at least one current generator. The forward voltage drop of the diode components has the same current responsiveness as the base-emitter voltage of the amplification components. A filter of the first order includes a differential gain stage with a capacitive component connected across the output of said stage or to its amplification components. A filter of the second order includes two differential gain stages, each with its capacitive component in circuit. An oscillator for controlling filters can comprise three series-connected lowpass filters each including its differential gain stage.

U.S. Pat. No. 5,357,209, issued Oct. 18, 1994, discloses a limiting amplifier having between an amplifier input and an amplifier output at least one amplifier stage as well as load components. The amplifier has an output signal limiting device for limiting the maximum amplitude of the output signal and the amplification and includes a current drain device connected to the amplifier stage output and drawing current through the load components. The amplifier stage includes a differential transistor pair amplifier stage with a differential input and a differential output, two current drain devices being connected to each one of the terminals of the differential output. The load components include a group of series connected diodes formed by NPN transistors with their base and collector electrodes connected together.

A problem with many known arrangements is that the delay of many known receivers is sensitive to changes in the input amplitude and input slew rate. A need exists for a receiver with delay generally insensitive to input amplitude and slew rate. Such a receiver with delay generally insensitive to input amplitude and slew rate is needed in order to minimize the jitter in a system.

SUMMARY OF THE INVENTION

A principal object of the present invention is to provide a receiver with delay generally insensitive to input amplitude and slew rate. Other important objects of the present invention are to provide such receiver with delay generally insensitive to input amplitude and slew rate substantially without negative effect and that overcome many of the disadvantages of prior art arrangements.

In brief, a receiver is provided with delay generally insensitive to input amplitude and slew rate. The receiver includes a first differential transistor pair having a common emitter connection. A differential input is applied to a respective base of the differential transistor pair. A pair of load transistors is connected to the respective collector of the differential transistor pair. A respective resistance is coupled to a base of the load transistors for providing a delay independent of the differential input; and a pair of bias transistors is coupled to the respective collector of the differential transistor pair for biasing the load transistors.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
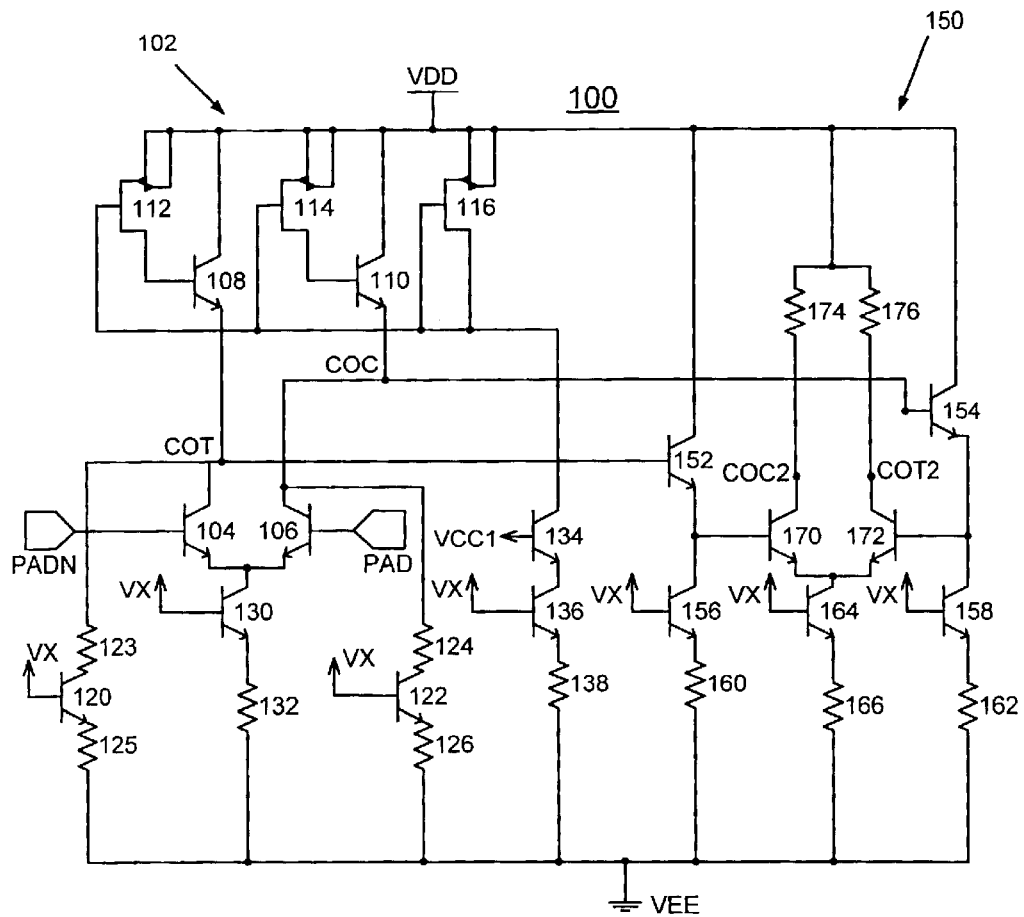
FIG. 1 is a schematic diagram representation illustrating a receiver in accordance with the preferred embodiment.

Having reference now to the drawings, in FIG. 1, there is shown a receiver generally designated by the reference character 100 in accordance with the preferred embodiment. In accordance with features of the preferred embodiment, receiver 100 has a delay that is substantially insensitive to changes in the input amplitude and input slew rate in order to minimize the jitter in the system.

Receiver 100 includes an input stage generally designated by reference character 102. Receiver input stage 102 includes a first bipolar NPN transistor 104 and a second bipolar NPN transistor 106 that form an input stage differential transistor pair. A differential signal input is applied to nodes PADN and PAD and to the respective base of differential transistor pair 104, 106.

A pair of bipolar NPN transistors 108 and 110 has a respective collector connected to a positive supply voltage rail VDD and a respective emitter connected to nodes COT and COC and to the respective collector of differential pair transistors 104, 106. A differential output of the input stage. 102 is provided at nodes COT and COC. The pair of bipolar NPN transistors 108 and 110 forms a load impedance similar to the prior art arrangements; however, rather than tying the bases of load impedance bipolar NPN transistors 108 and 110 to their respective collectors to form diodes, the respective bases are connected to a bias reference formed by a plurality of P-channel field effect transistors (PFETs) 112, 114, and 116. PFETs 112, 114 provide a resistance to the respective base of NPN transistors 108 and 110 that are effective to provide a delay independent of the differential signal input.

A pair of bias, bipolar NPN transistors 120 and 122 provides a small amount of current to load impedance bipolar NPN transistors 108 and 110 to always ensure that transistors 108 and 110 are slightly biased. Bias NPN transistors 120 and 122 are respectively coupled by a pair of resistors 123 and 124 to the respective nodes COT and COC and are respectively coupled by a pair of resistors 125 and 126 to a negative supply voltage rail VEE, for example, ground potential. Resistors 124 and 126 function to substantially isolate nodes COT and COC from the capacitance of bias NPN transistors 120 and 122.

Input stage differential pair transistors 104, 106 are connected to negative supply voltage rail VEE by a series connected current source bipolar NPN transistor 130 and a resistor 132. The collector of NPN transistor 130 is connected to the emitters of the differential pair transistors 104, 106. The base of NPN transistor 130 is connected to a reference voltage VX. PFETs 112,114,116 are connected to negative supply voltage rail VEE by a series connected pair of bipolar NPN transistors 134, 136 and a resistor 138. The bases of NPN transistors 134, 136 are respectively connected to a second reference voltage VCC1 and reference voltage VX.

The input signal for the receiver 100 ranges, for example, from 50 mV to 1.14 Volts peak-to-peak differential. The reference voltage VX is a set voltage higher than negative supply voltage rail VEE, for example, 1.2 volts higher than negative supply voltage rail VEE. The second reference voltage VCC1 is, for example, 2.6 volts higher than negative supply voltage rail VEE. The positive supply voltage rail VDD is, for example, 3.3 volts higher than negative supply voltage rail VEE.

Receiver 100 includes a second stage generally designated by reference character 150 providing a differential output at nodes COC2 and COT2. Stage 150 of the receiver amplifier 100 is formed by the emitter follower level shifter formed by a plurality of bipolar NPN transistors 152, 154, 156, 158 and a pair of resistors 160, 162 and a differential pair formed by a current source bipolar NPN transistor 164 and a resistor 166 and a differential pair bipolar NPN transistors 170, 172 and a respective pair of load resistors 174, 176.

The bases of emitter follower NPN transistors 152, 154 are respectively connected to input stage nodes COT and COC. Emitter follower level shifter transistors 152, 156 and resistor 160, and transistors 154, 158 and resistor 162 are respectively connected in series between the positive supply voltage rail VDD and the negative supply voltage rail VEE. The differential pair transistor 170, 172 have collectors respectively connected by the load resistors 174, 176 to the positive supply voltage rail VDD. The differential pair transistors 170, 172 are connected to negative supply voltage rail VEE by the series connected current source bipolar NPN transistor 164 and resistor 166. The collector of NPN transistor 164 is connected to the emitters of the differential pair transistors 170, 172. The base of NPN transistor 164 is connected to the reference voltage VX.

The combination of noise and inter-symbol interference (ISI) amounts, for example, to 100 mV of possible noise. Receiver 100 has less than 3 pS of delay variation due to the ISI and noise effects.

Figure 2A:
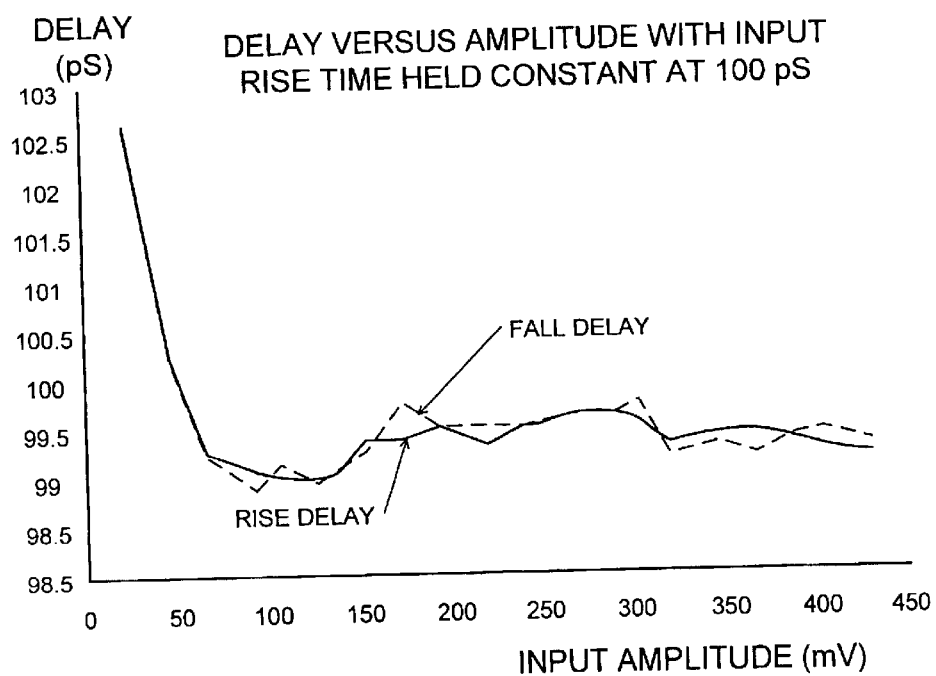
FIGS. 2A, 2B, and 2C are charts illustrating operation of the receiver of FIG. 1 in accordance with the preferred embodiment.
Figure 2B:
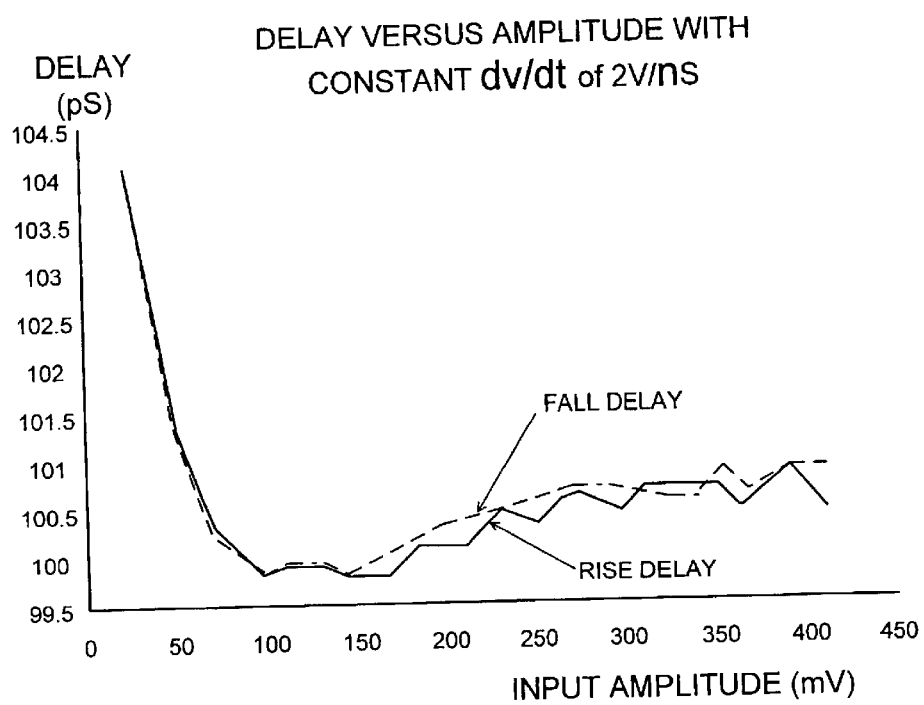
Figure 2C:
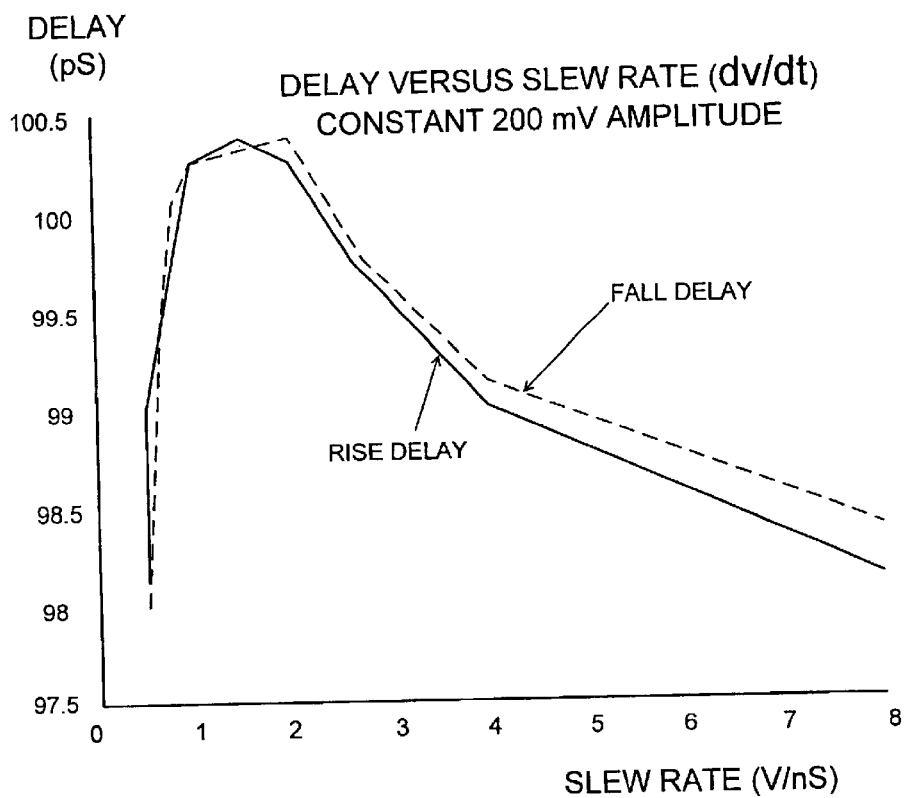

Referring to FIGS. 2A, 2B, and 2C, there are shown charts illustrating operation of the receiver 100 in accordance with the preferred embodiment. In FIG. 2A, the horizontal axis represents input amplitude in mV, with the input rise time held constant at 100 pS, and the vertical axis represents delay in pS. The rise delay is shown in solid line and fall delay is shown in dotted line. In the range of operation of receiver 100 with the input signal of 50 mV or greater, it is shown that the delay variation is small with respect to variable signal input amplitude.

FIG. 2B illustrates delay in pS versus input amplitude in mV with a constant slew rate (dv/dt) of 2 V/nS. The rise delay is shown in solid line and fall delay is shown in dotted line. In the range of operation of receiver 100 with the input signal of 50 mV or greater, FIG. 2B similarly shows that the delay variation is small with respect to variable signal input amplitude.

FIG. 2C illustrates delay in pS versus slew rate (dv/dt) in V/nS with a constant 200 mV input amplitude. The rise delay is shown in solid line and fall delay is shown in dotted line. In the operation of receiver 100, it is shown that the delay variation similarly is small with respect to variable slew rate.

Figure 3:
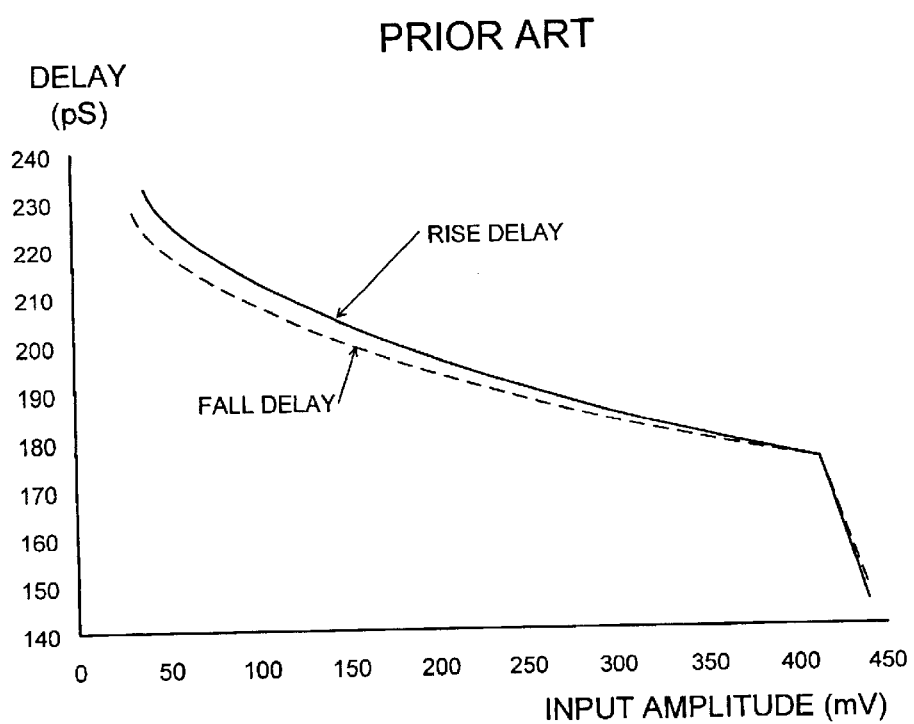
FIG. 3 is a chart illustrating operation of a conventional, prior art bipolar differential receiver.

FIG. 3 is a chart similar to FIG. 2A illustrating operation of a conventional, prior art bipolar differential receiver. The improved operation of receiver 100 can be understood by comparing the operation of the prior art bipolar differential receiver of FIG. 3 with the operation of the receiver 100 shown in FIG. 2.

It should be understood that numerous modifications and substitutions may be made without deviating from the scope of the invention. For example, PNP transistors can be substituted for the NPN transistors shown and similarly NFETs can be substituted for the PFETs. It should be understood that PFETs 112, 114 could be replaced by resistors connected between the positive voltage rail and the respective bases of load transistors 108, 110 and then PFET 116, NPN transistors 134, 136 and resistor 138 would also be eliminated.

While the present invention has been described with reference to the details of the embodiments of the invention shown in the drawing, these details are not intended to limit the scope of the invention as claimed in the appended claims.

What is claimed is:

1. A receiver having delay generally insensitive to input amplitude and slew rate comprising:
    a first differential transistor pair having a common emitter connection;
    a differential input applied to a respective base of said differential transistor pair;
    a pair of load transistors, said load transistors respectively connected to a respective collector of said differential transistor pair;
    a respective resistance coupled to a base of said load transistors for providing a delay independent of said differential input; and
    a pair of bias transistors coupled to said respective collector of said differential transistor pair for biasing said load transistors.

2. A receiver as recited in claim 1 wherein a differential output is provided at a respective collector of said first differential transistor pair.

3. A receiver as recited in claim 1 includes a current source coupled to said common emitter connection.

4. A receiver as recited in claim 3 wherein said current source includes a series connected bipolar transistor and a resistor coupled between said common emitter connection and a voltage supply rail.

5. A receiver as recited in claim 1 wherein each said respective resistance coupled to said base of said load transistors includes a field effect transistor coupled between a voltage supply rail and said base of said load transistors.

6. A receiver as recited in claim 5 further includes a common current source coupled to a gate of each said field effect transistor.

7. A receiver as recited in claim 1 wherein each said field effect transistor includes a P-channel field effect transistor (PFET).

8. A receiver as recited in claim 1 includes a respective resistor connecting each of said pair of bias transistors and said respective collector of said differential transistor pair.

9. A receiver as recited in claim 1 includes a second stage emitter follower level shifter.

10. A receiver as recited in claim 9 wherein said second stage emitter follower level shifter includes first and second pairs of series connected transistors and a respective resistor coupled between positive and negative supply rails; a differential output provided at a respective collector of said first differential transistor pair applied to a base of one transistor of said first and second pairs; and a second stage differential transistor pair having a common emitter connection and a respective base connected to a collector-emitter junction of said first and second pairs; and a current source connected to said common emitter connection of said second stage differential transistor pair.

11. A receiver as recited in claim 10 includes a pair of load resistors; said respective load resistors coupled between respective collectors of said second stage differential transistor pair and a voltage supply rail.

12. A receiver having delay generally insensitive to input amplitude and slew rate comprising:
   an input stage including a first differential transistor pair; a pair of load transistors, and a pair of bias transistors;
   said first differential transistor pair having a common emitter connection;
   a differential input applied to a respective base of said differential transistor pair;
   said load transistors respectively connected to a respective collector of said differential transistor pair;
   a first stage differential output provided at said respective collectors of said first differential transistor pair;
   a respective resistance coupled to a base of said load transistors for providing a delay independent of said differential input;
   said pair of bias transistors coupled to said respective collector of said differential transistor pair for biasing said load transistors; and
   a second stage emitter follower level shifter coupled to said input stage and receiving said differential output provided at said respective collectors of said first differential transistor pair and providing a second stage differential output.

13. A receiver as recited in claim 12 includes a current source coupled to said common emitter connection of said first differential transistor pair.

14. A receiver as recited in claim 12 wherein each said respective resistance includes a field effect transistor coupled between a voltage supply rail and said respective base of said load transistors.

15. A receiver as recited in claim 14 wherein said load transistors includes a pair of NPN transistors and wherein said field effect transistor includes a P-channel field effect transistor (PFET) and wherein one said PFET is connected between a positive voltage supply rail and said base of each of said pair of NPN transistors.

16. A receiver as recited in claim 14 further includes a common current source coupled to a gate of each said field effect transistor.

17. A receiver as recited in claim 12 wherein said second stage emitter follower level shifter includes first and second pairs of series connected transistors and a respective resistor coupled between positive and negative supply rails; said first stage differential output applied to a base of one transistor of said first and second pairs; and a second stage differential transistor pair having a common emitter connection and a respective base connected to a collector-emitter junction of said first and second pairs; and a current source connected to said common emitter connection of said second stage differential transistor pair.

18. A receiver as recited in claim 17 includes a pair of load resistors; said respective load resistors coupled between respective collectors of said second stage differential transistor pair and a voltage supply rail.

19. A receiver as recited in claim 18 wherein said second stage differential output is provided at respective junction connections of said load resistors and said respective collectors of said second stage differential transistor pair.

* * * * *